United States Patent
Watanabe et al.

(10) Patent No.: US 9,754,863 B2
(45) Date of Patent: Sep. 5, 2017

(54) SEMICONDUCTOR DEVICE

(71) Applicant: FUJI ELECTRIC CO., LTD., Kawasaki-shi (JP)

(72) Inventors: Sota Watanabe, Matsumoto (JP); Hiroaki Furihata, Azumino (JP); Makoto Imai, Suwa (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/177,827

(22) Filed: Jun. 9, 2016

(65) Prior Publication Data
US 2016/0365303 A1 Dec. 15, 2016

(30) Foreign Application Priority Data
Jun. 12, 2015 (JP) .................. 2015-119233

(51) Int. Cl.
*H01L 23/495* (2006.01)
*H05K 7/10* (2006.01)
(Continued)

(52) U.S. Cl.
CPC .... *H01L 23/49537* (2013.01); *H01L 23/3107* (2013.01); *H01L 23/49503* (2013.01); *H01L 23/49562* (2013.01); *H01L 23/49568* (2013.01); *H01L 23/49575* (2013.01); *H01L 23/49* (2013.01); *H01L 27/082* (2013.01); *H01L 27/088* (2013.01); *H01L 27/0814* (2013.01); *H01L 29/7393* (2013.01); *H01L 29/78* (2013.01); *H01L 29/861* (2013.01); *H01L 2224/0603* (2013.01); *H01L 2224/48091* (2013.01); *H01L 2224/48137* (2013.01); *H01L 2224/48247* (2013.01); *H01L 2924/181* (2013.01); *H01L 2924/19107* (2013.01)

(58) Field of Classification Search
CPC ............... H01L 23/49537; H01L 23/49; H01L 23/49568; H01L 23/3107; H01L 23/49503; H01L 23/49562; H01L 23/49575
See application file for complete search history.

(56) References Cited

U.S. PATENT DOCUMENTS 7,528,469 B2* 5/2009 Kawakita ................ H01L 23/34
257/666
8,723,304 B2* 5/2014 Kang .................. H01L 23/4952
257/666
(Continued)

FOREIGN PATENT DOCUMENTS

JP 2003-533049 A 11/2003
JP 2007-294669 A 11/2007
(Continued)

*Primary Examiner* — Alonzo Chambliss
(74) *Attorney, Agent, or Firm* — Manabu Kanesaka

(57) ABSTRACT

The semiconductor device improves heat dissipation by loading a diode and a MOSFET or IGBT in a single package. A drain electrode disposed on a rear surface of a MOSFET chip is soldered to an upper surface of a first lead frame, and a cathode electrode disposed on a rear surface of a diode chip is soldered to an upper surface of a second lead frame. Rear surfaces of the first lead frame and second lead frame to which neither the diode chip nor the MOSFET chip is connected are disposed so as to be exposed from a sealing resin.

19 Claims, 16 Drawing Sheets

(51) Int. Cl.
  *H01L 21/00*    (2006.01)
  *H01L 23/31*    (2006.01)
  *H01L 29/739*   (2006.01)
  *H01L 29/78*    (2006.01)
  *H01L 29/861*   (2006.01)
  *H01L 27/082*   (2006.01)
  *H01L 27/088*   (2006.01)
  *H01L 27/08*    (2006.01)
  *H01L 23/49*    (2006.01)

(56) References Cited

U.S. PATENT DOCUMENTS

| | | | |
|---|---|---|---|
| 2003/0089980 A1 | 5/2003 | Herfurth et al. | |
| 2011/0115062 A1* | 5/2011 | Yokoe | H01L 23/49524 |
| | | | 257/676 |
| 2013/0320496 A1* | 12/2013 | Nishijima | H01L 23/4952 |
| | | | 257/532 |
| 2014/0299979 A1 | 10/2014 | Danno et al. | |
| 2015/0035129 A1* | 2/2015 | Zhang | H01L 23/49534 |
| | | | 257/675 |

FOREIGN PATENT DOCUMENTS

| | | |
|---|---|---|
| JP | 2008-177179 A | 7/2008 |
| JP | 2010-177619 A | 8/2010 |
| JP | 2014-086536 A | 5/2014 |

\* cited by examiner

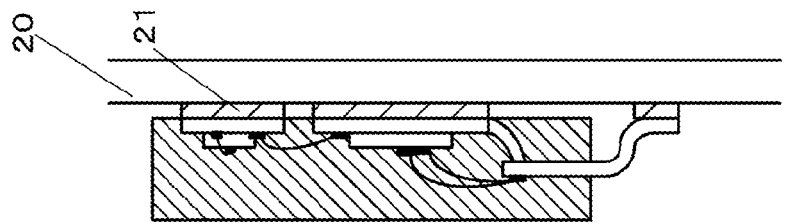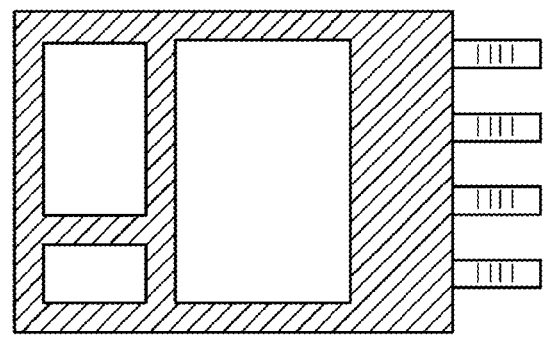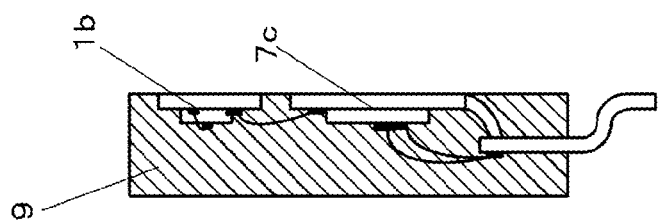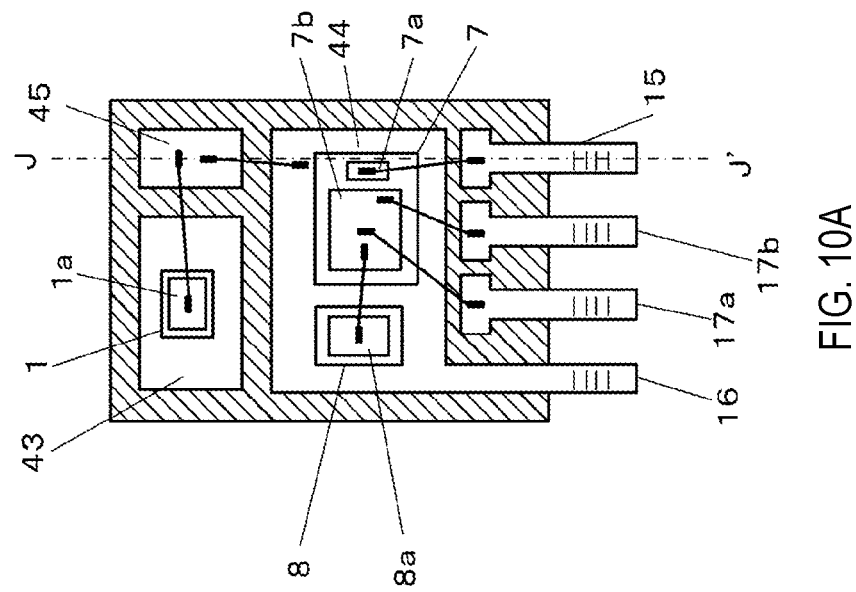

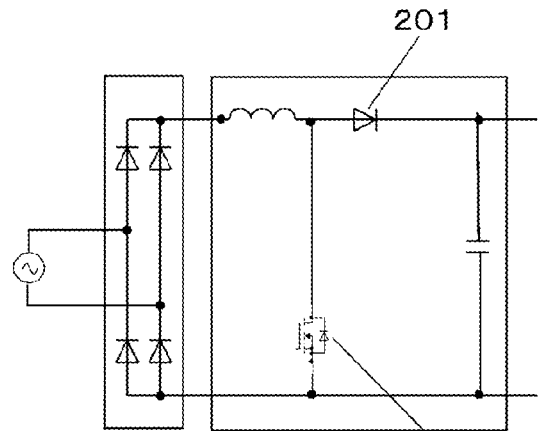
FIG. 15A Classic
Prior Art
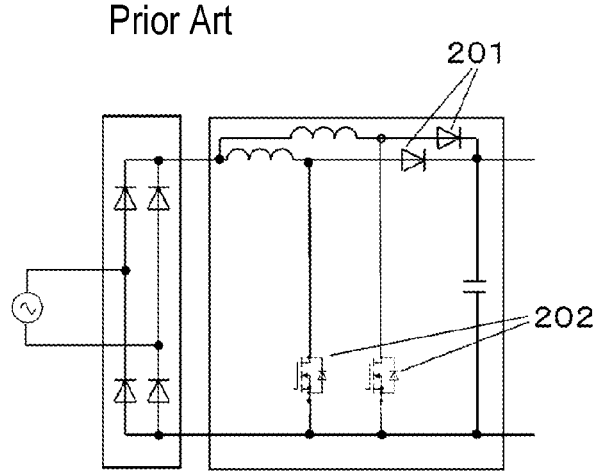
FIG. 15B Interleaved
Prior Art
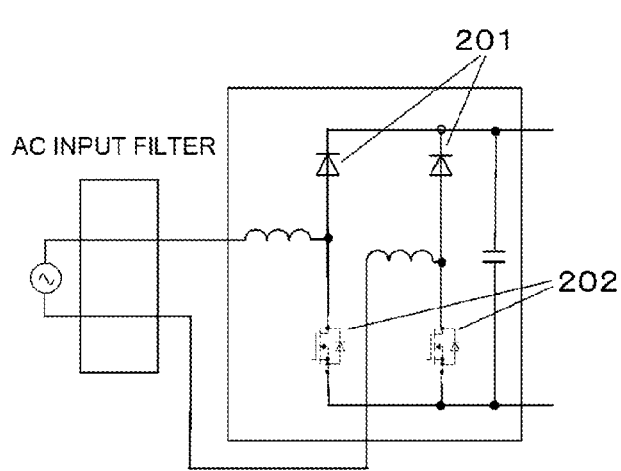
FIG. 15C Bridgeless
Prior Art

SEMICONDUCTOR DEVICE

RELATED APPLICATIONS

The present application is based on, and claims priority from, Japanese Application No. JP2015-119233 filed Jun. 12, 2015, the disclosure of which is hereby incorporated by reference herein in its entirety.

BACKGROUND OF THE INVENTION

1. Field of the Invention

The present invention relates to a semiconductor device incorporated in a power circuit.

2. Description of the Related Art

Diodes and metal oxide semiconductor field effect transistors (MOSFETs) or insulated gate bipolar transistors (IGBTs) that are used in power factor correction/power factor controller (PFC) circuits of FIGS. 15A-15C and chopper circuits that are incorporated in power circuits are packaged individually and mounted on a substrate.

In a case where the diodes and the MOSFETs or IGBTs are discretely packaged, cooling fins that are attached to the rear surface of each package release heat. On the other hand, in a case where the diodes and the MOSFETs or IGBTs are surface-mount devices (SMD), the rear surfaces thereof are attached to a substrate and release heat.

In a case where a diode element 301 and a MOSFET element 401 are discretely packaged as shown in FIG. 16, a space for mounting each of these packages needs to be provided, and then cooling fins need to be attached as well. Because an anode terminal 303 of the diode element 301 and a drain terminal 403 of the MOSFET element 401 (a collector terminal in case of an IGBT element) are connected to each other by a wiring pattern 500 formed on a substrate, the wiring pattern 500 causes inductance (referred to as "wiring inductance," hereinafter), thereby generating spike voltage due to the wiring inductance at the time of a switching operation. For this reason, a combination of a diode and a MOSFET or IGBT that has a rated voltage equal to or greater than the spike voltage needs to be selected.

As a method for reducing such a mounting space, there is a semiconductor device having a diode and a MOSFET or IGBT loaded in a single package (see Japanese Patent Application Laid-open No. 2007-294669, for example).

Patent Document 1: Japanese Patent Publication No. 2007-294669

SUMMARY OF THE INVENTION

However, loading a diode and a MOSFET or IGBT in a single package is not adequate to release heat, and consequently raises the possibility of thermal destruction of the semiconductor device.

The present invention provides a semiconductor device in which improved heat dissipation can be made even by loading a diode and a MOSFET or IGBT in a single package.

According to an embodiment of the present invention, a semiconductor device has a first lead frame and a second lead frame, wherein the first lead frame has a first terminal, a second lead frame has a second terminal, one of principal surfaces of the first lead frame has a first semiconductor chip, one of principal surfaces of the second lead frame has a second semiconductor chip, a first electrode disposed on a front surface of the first semiconductor chip is electrically connected to the principal surface of the second lead frame by a bonding wire, a front surface of the second semiconductor chip has a second electrode and a third electrode, the second electrode is electrically connected to a third terminal and a fourth terminal by bonding wires, the third electrode is electrically connected to a fifth terminal by a bonding wire, and the other one of the principal surfaces of the first lead frame and the other one of the principal surfaces of the second lead frame are disposed so as to be exposed from a sealing resin.

The first electrode may be connected to one of principal surfaces of a third lead frame by a bonding wire, the principal surface of the third lead frame may be connected to the principal surface of the first lead frame by a bonding wire, and the other one of the principal surfaces of the third lead frame may be exposed from the sealing resin.

According to another embodiment of the present invention, a semiconductor device has a fourth lead frame and a fifth lead frame, wherein the fourth lead frame has a sixth terminal, a fifth lead frame has a seventh terminal, one of principal surfaces of the fourth lead frame has a third semiconductor chip, one of principal surfaces of the fifth lead frame has a fourth semiconductor chip and a fifth semiconductor chip, a fourth electrode disposed on a front surface of the third semiconductor chip is electrically connected to the principal surface of the fifth lead frame by a bonding wire, a front surface of the fourth semiconductor chip has a fifth electrode and a sixth electrode, a front surface of the fifth semiconductor chip has a seventh electrode, the fifth electrode is electrically connected an eighth terminal and a ninth terminal by bonding wires, the sixth electrode is electrically connected to a tenth terminal by a bonding wire, the seventh electrode is electrically connected to the fifth electrode by a bonding wire, and the other one of the principal surfaces of the fourth lead frame and the other one of the principal surfaces of the fifth lead frame are disposed so as to be exposed from a sealing resin.

The fourth electrode may be connected to one of principal surfaces of a sixth lead frame by a bonding wire, the principal surface of the sixth lead frame may be connected to the principal surface of the fourth lead frame by a bonding wire, and the other one of the principal surfaces of the sixth lead frame may be exposed from the sealing resin.

The present invention provides a semiconductor device in which improved heat dissipation can be obtained even by loading a diode and a MOSFET or IGBT in a single package.

BRIEF DESCRIPTION OF THE DRAWINGS

FIGS. 10A-10D are diagrams showing Embodiment 10 of the present invention;

FIGS. 15A-15C are diagrams showing an example of a PFC circuit; and

DESCRIPTION OF THE PREFERRED EMBODIMENTS

The present invention is described hereinafter by means of embodiments thereof, but the following embodiments are not intended to limit the inventions pertaining to the scope of claims. Not all the combinations of features described in the embodiments are required as the solutions to the problems to be solved by the present invention.

Embodiment 1

Figure 1C:
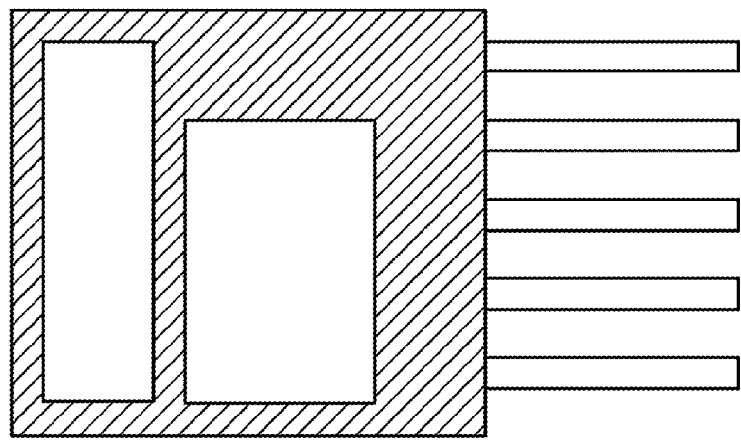
FIGS. 1A-1C are diagrams showing Embodiment 1 of the present invention.
Figure 1B:
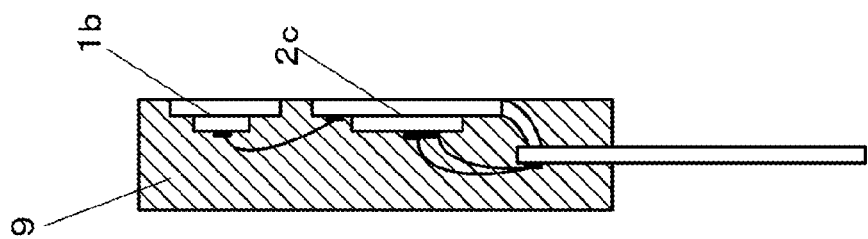
Figure 1A:
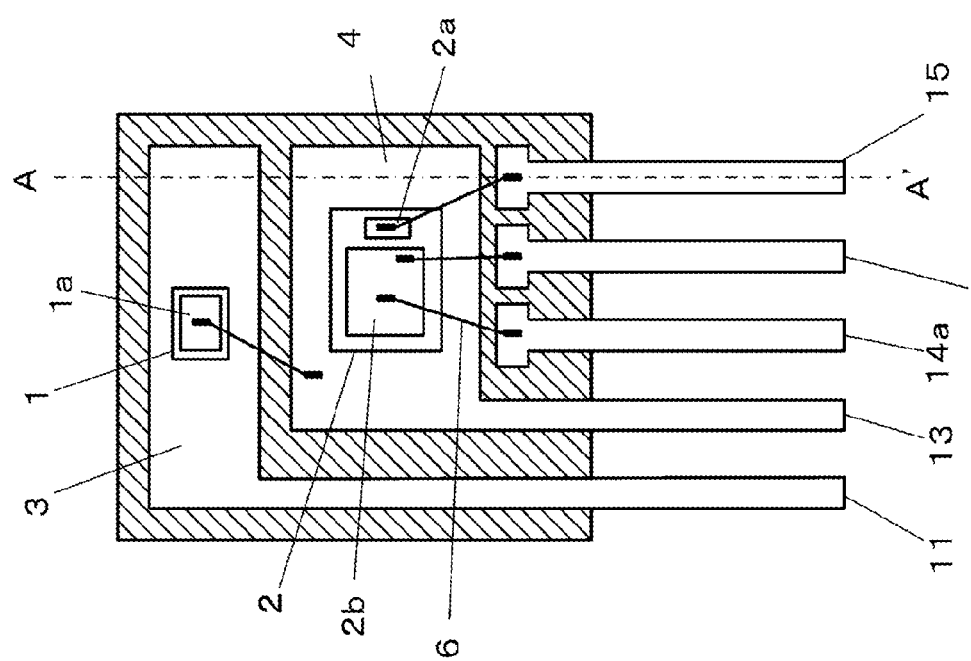

FIGS. 1A-1C show Embodiment 1. FIG. 1A is a plan view (sealing resin on the upper surface is not shown), FIG. 1B a cross-sectional diagram taken along A-A', and FIG. 1C a rear view.

A cathode electrode 1b disposed on the rear surface of a diode chip 1 is soldered (not shown) to an upper surface of a first lead frame 3.

A drain electrode 2c disposed on the rear surface of a MOSFET chip 2 is soldered (not shown) to an upper surface of a second lead frame 4.

A cathode terminal 11 is disposed in the first lead frame 3, and a drain terminal 13 is disposed in the second lead frame 4.

An anode electrode 1a disposed on the front surface of the diode chip 1 is connected to the second lead frame 4 by a bonding wire 6 and electrically connected to the drain electrode 2c of the MOSFET chip 2.

A gate electrode 2a disposed on the front surface of the MOSFET chip 2 is electrically connected to a gate terminal 15 by a bonding wire 6.

A source electrode 2b disposed on the front surface of the MOSFET chip 2 is electrically connected to source terminals 14a, 14b by bonding wires 6.

The rear surfaces of the first lead frame 3 and second lead frame 4 on which neither the diode chip 1 nor the MOSFET chip 2 is disposed are disposed so as to be exposed from a sealing resin 9.

The cathode terminal 11, drain terminal 13, source terminal 14a, source terminal 14b, and gate terminal 15 are disposed adjacent to each other and exposed from the sealing resin 9.

Loading the diode chip 1 and the MOSFET chip 2 in a single package can accomplish electrical connection between the anode electrode 1a of the diode chip 1 and the drain electrode 2c of the MOSFET chip 2 in the package. As a result, the occurrence of inductance induced by a wiring pattern (referred to as "wiring inductance," hereinafter) can be curbed, preventing the generation of spike voltage that is caused due to the wiring inductance at the time of a switching operation.

Discretely packaging the first lead frame 3 and the second lead frame 4 so that the rear surfaces thereof are exposed from the sealing resin 9, can improve the heat dissipation.

Embodiment 1 illustrates an example in which the diode chip 1 and the MOSFET chip 2 are loaded in a single package; however, the MOSFET chip 2 may be replaced with an IGBT chip 7.

Embodiment 2

Figure 2C:
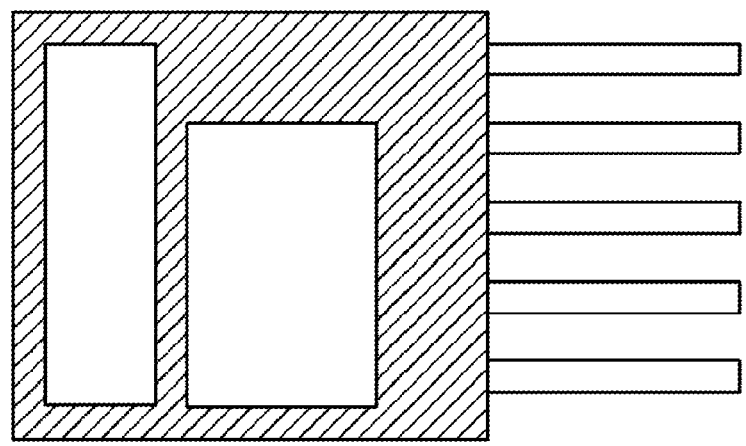
FIGS. 2A-2C are diagrams showing Embodiment 2 of the present invention.
Figure 2B:
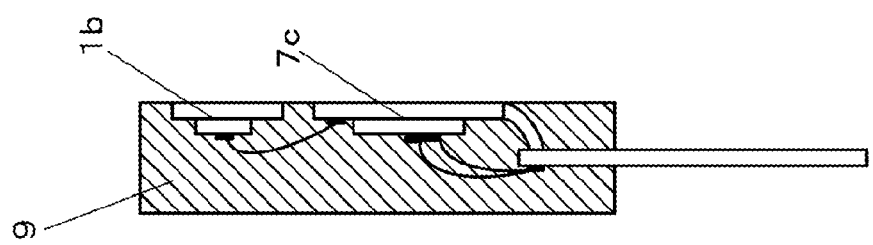
Figure 2A:
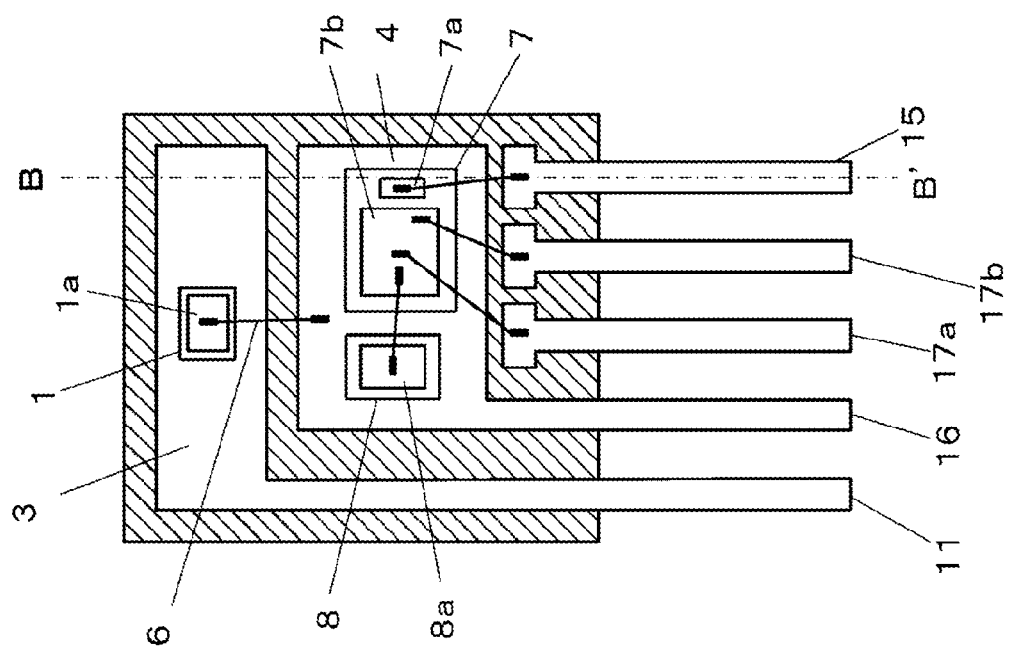

FIGS. 2A-2C show Embodiment 2. FIG. 2A is a plan view (sealing resin on the upper surface is not shown), FIG. 2B a cross-sectional diagram taken along B-B', and FIG. 2C a rear view.

The cathode electrode 1b disposed on the rear surface of the diode chip 1 is soldered (not shown) to the upper surface of the first lead frame 3.

A collector electrode 7c disposed on the rear surface of an IGBT chip 7 and a cathode electrode 8b disposed on the rear surface of a free wheeling diode (FWD) chip 8 are soldered (not shown) to the upper surface of the second lead frame 4, wherein the collector electrode 7c and the cathode electrode 8b are electrically connected to each other.

The cathode terminal 11 is disposed in the first lead frame 3, and a collector terminal 16 is disposed in the second lead frame 4.

The anode electrode 1a disposed on the front surface of the diode chip 1 is connected to the second lead frame 4 by a bonding wire 6 and electrically connected to the collector electrode 7c of the IGBT chip 7.

An anode electrode 8a disposed on the front surface of the FWD chip 8 is electrically connected to an emitter electrode 7b on the front surface of the IGBT chip 7 by a bonding wire 6.

A gate electrode 7a disposed on the front surface of the IGBT chip 7 is electrically connected to the gate terminal 15 by a bonding wire 6.

The emitter electrode 7b disposed on the front surface of the IGBT chip 7 is electrically connected to emitter terminals 17a, 17b by bonding wires 6.

The rear surfaces of the first lead frame 3 and second lead frame 4 on which neither the diode chip 1 nor the IGBT chip 7 is disposed are disposed so as to be exposed from the sealing resin 9.

The cathode terminal 11, collector terminal 16, emitter terminal 17a, emitter terminal 17b, and gate terminal 15 are disposed adjacent to each other and exposed from the sealing resin 9.

Loading the diode chip 1, IGBT chip 7, and FWD chip 8 in a single package can accomplish electrical connection between the anode electrode 1a of the diode chip 1 and the collector electrode 7c of the IGBT chip 7 in the package. As a result, the occurrence of inductance induced by a wiring pattern (referred to as "wiring inductance," hereinafter) can be curbed, preventing the generation of spike voltage that is caused due to the wiring inductance at the time of a switching operation.

Loading the FWD chip 8 in the same package can eliminate the wiring pattern of the substrate, accomplishing space conservation.

Discretely packaging the first lead frame 3 and the second lead frame 4 so that the rear surfaces thereof are exposed from the sealing resin 9, can improve the heat dissipation.

Embodiment 3

Figure 3A:
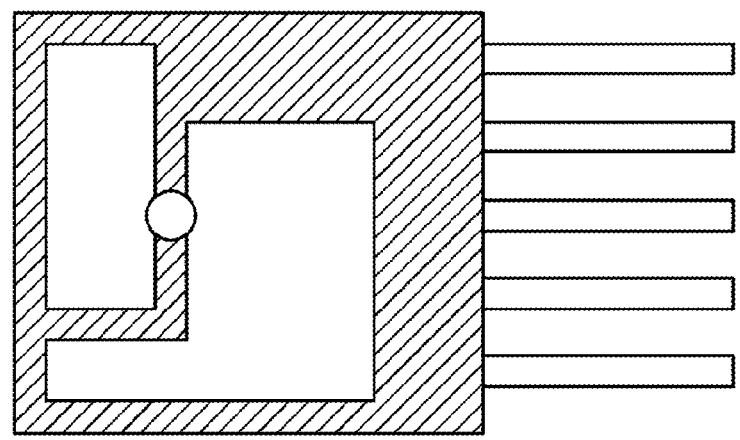
FIGS. 3A-3C are diagrams showing Embodiment 3 of the present invention.
Figure 3B:
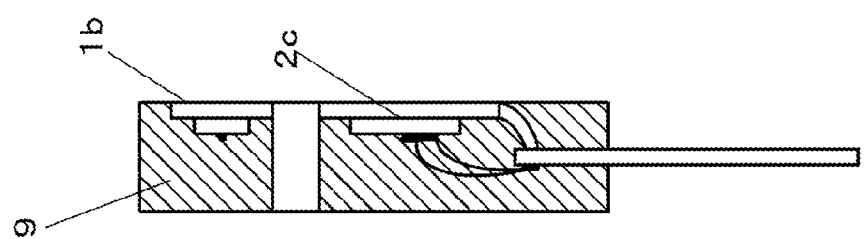
Figure 3C:
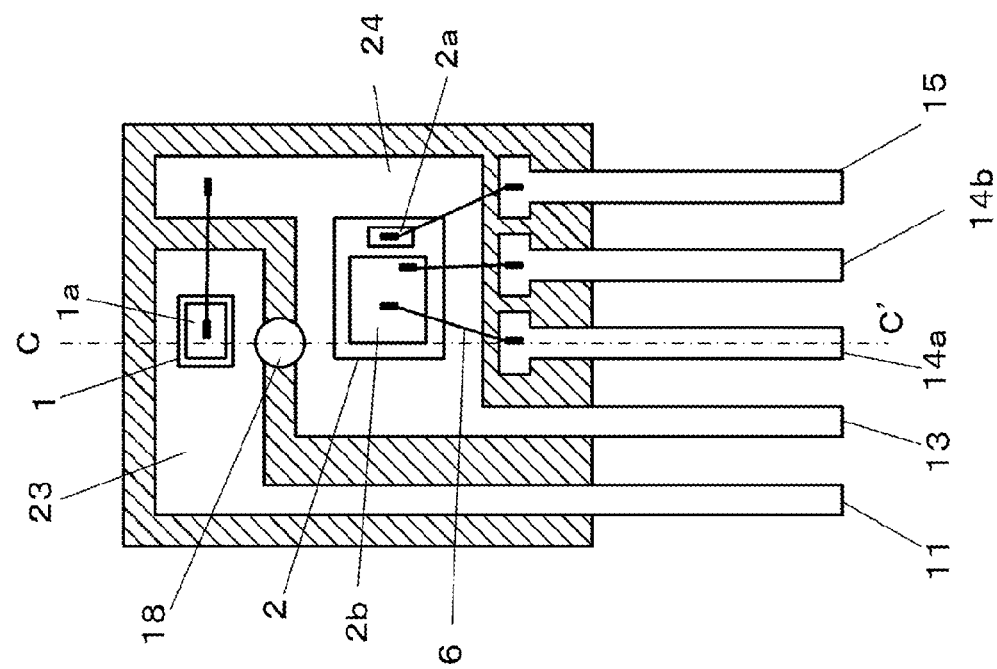

FIGS. 3A-3C show Embodiment 3. FIG. 3A is a plan view (sealing resin on the upper surface is not shown), FIG. 3B a cross-sectional diagram taken along C-C', and FIG. 3C a rear view.

In Embodiment 3, a through-hole 18 for fixing a cooling fin to the structure of Embodiment 1 is provided between a first lead frame 23 and a second lead frame 24.

Attaching a cooling fin by providing this through-hole 18 can further improve the cooling efficiency.

Embodiment 4

Figure 4C:
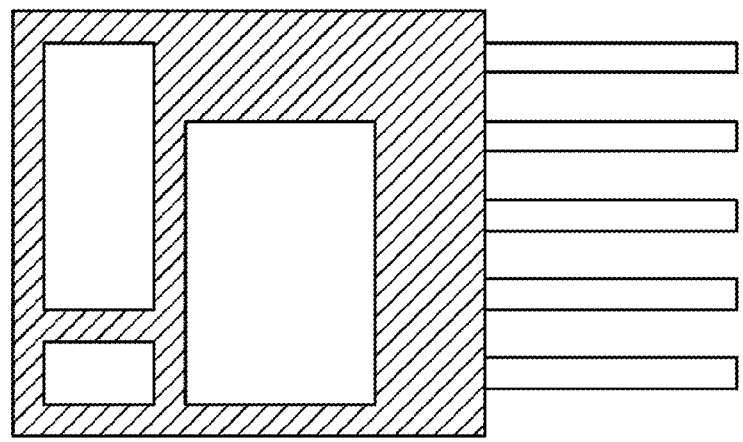
FIGS. 4A-4C are diagrams showing Embodiment 4 of the present invention.
Figure 4B:
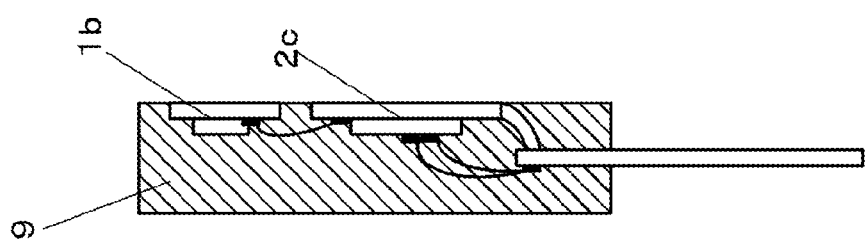
Figure 4A:
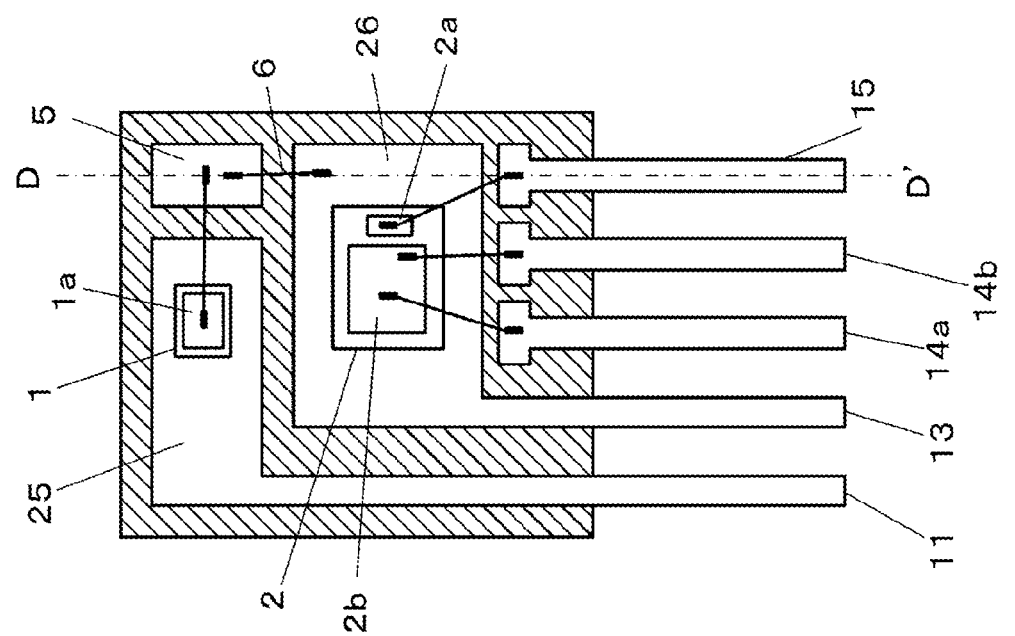

FIGS. 4A-4C show Embodiment 4. FIG. 4A is a plan view (sealing resin on the upper surface is not shown), FIG. 4B a cross-sectional diagram taken along D-D', and FIG. 4C a rear view.

The difference with Embodiment 1 is that Embodiment 4 has a third lead frame 5.

The cathode electrode 1b disposed on the rear surface of the diode chip 1 is soldered (not shown) to an upper surface of a first lead frame 25.

The drain electrode 2c disposed on the rear surface of the MOSFET chip 2 is soldered (not shown) to an upper surface of a second lead frame 26.

The cathode terminal 11 is disposed in the first lead frame 25, and the drain terminal 13 is disposed in the second lead frame 26.

The anode electrode 1a disposed on the front surface of the diode chip 1 is connected to the third lead frame 5 by a bonding wire 6. In addition, the third lead frame 5 and the second lead frame 26 are connected to each other by a bonding wire 6. Therefore, the anode electrode 1a disposed on the front surface of the diode chip 1 is electrically connected to the drain electrode 2c of the MOSFET chip 2 with the third lead frame 5 therebetween.

The gate electrode 2a disposed on the front surface of the MOSFET chip 2 is electrically connected to the gate terminal 15 by a bonding wire 6.

The source electrode 2b disposed on the front surface of the MOSFET chip 2 is electrically connected to the source terminals 14a, 14b by bonding wires 6.

The rear surfaces of the first lead frame 25 and second lead frame 26 on which neither the diode chip 1 nor the MOSFET chip 2 is disposed and the rear surface of the third lead frame 5, are disposed so as to be exposed from the sealing resin 9.

Exposing the rear surface of the third lead frame 5 can improve the heat dissipation better than Embodiment 1.

Embodiment 4 illustrates an example in which the diode chip 1 and the MOSFET chip 2 are loaded in a single package; however, the MOSFET chip 2 may be replaced with the IGBT chip 7, as in Embodiment 1.

Embodiment 5

Figure 5C:
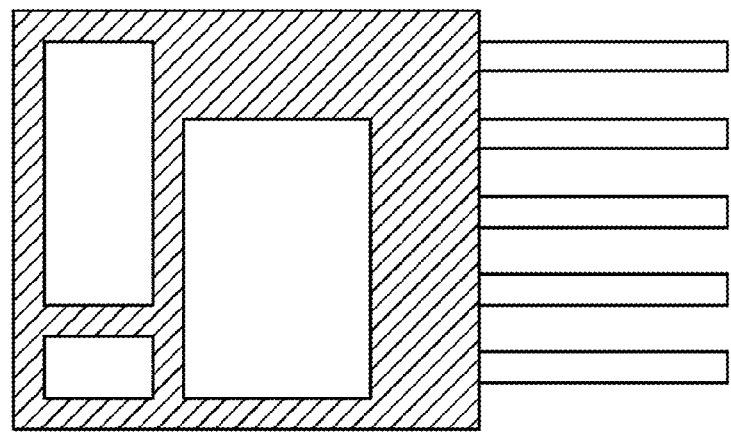
FIGS. 5A-5C diagrams showing Embodiment 5 of the present invention.
Figure 5B:
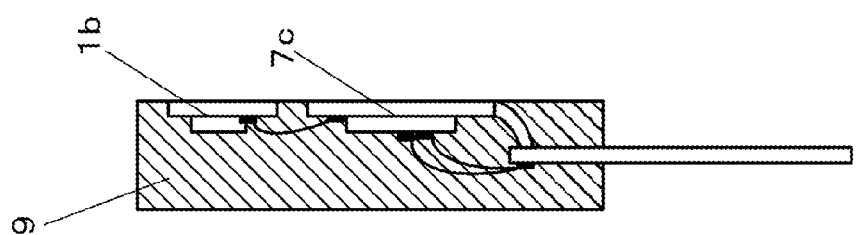
Figure 5A:
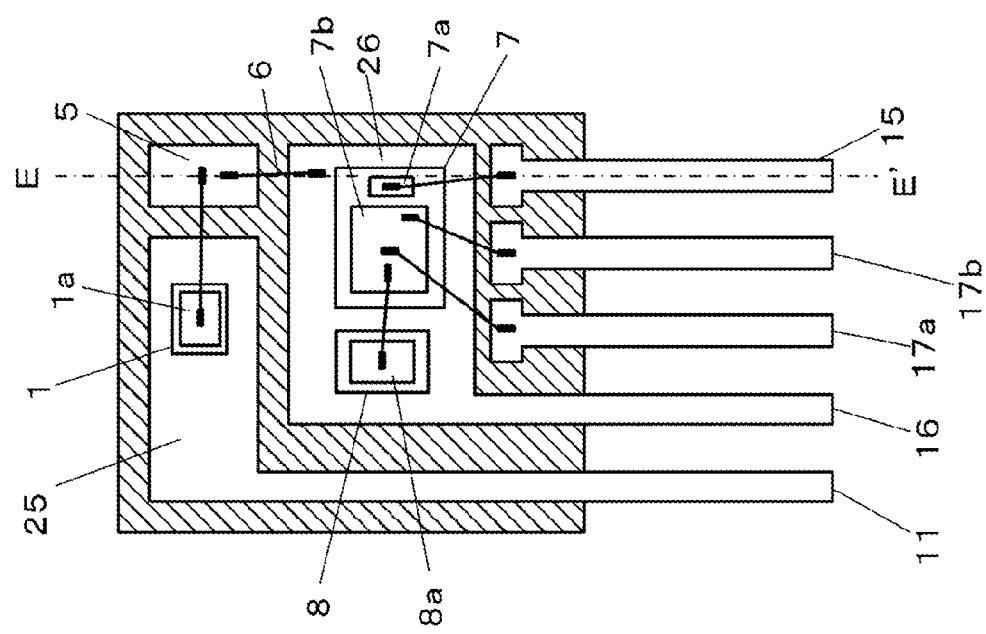

FIGS. 5A-5C show Embodiment 5. FIG. 5A is a plan view (sealing resin on the upper surface is not shown), FIG. 5B a cross-sectional diagram taken along E-E', and FIG. 5C a rear view.

The difference with Embodiment 2 is that Embodiment 5 has the third lead frame 5.

The cathode electrode 1b disposed on the rear surface of the diode chip 1 is soldered (not shown) to the upper surface of the first lead frame 25.

The collector electrode 7c disposed on the rear surface of the IGBT chip 7 and the cathode electrode 8b disposed on the rear surface of the free wheeling diode (FWD) chip 8 are soldered (not shown) to the upper surface of the second lead frame 26, wherein the collector electrode 7c and the cathode electrode 8b are electrically connected to each other.

The cathode terminal 11 is disposed in the first lead frame 25, and the collector terminal 16 is disposed in the second lead frame 26.

The anode electrode 1a disposed on the front surface of the diode chip 1 is connected to the third lead frame 5 by a bonding wire 6. In addition, the third lead frame 5 and the second lead frame 26 are connected to each other by a bonding wire 6. Therefore, the anode electrode 1a disposed on the front surface of the diode chip 1 is electrically connected to the collector electrode 7c of the IGBT chip 7 with the third lead frame 5 therebetween.

The anode electrode 8a disposed on the front surface of the FWD chip 8 is electrically connected to the emitter electrode 7b on the front surface of the IGBT chip 7 by a bonding wire 6.

The gate electrode 7a disposed on the front surface of the IGBT chip 7 is electrically connected to the gate terminal 15 by a bonding wire 6.

The emitter electrode 7b disposed on the front surface of the IGBT chip 7 is electrically connected to the emitter terminals 17a, 17b by bonding wires 6.

The rear surfaces of the first lead frame 25 and second lead frame 26 on which neither the diode chip 1 nor the IGBT chip 7 is disposed and the rear surface of the third lead frame 5, are disposed so as to be exposed from the sealing resin 9.

Exposing the rear surface of the third lead frame 5 can improve the heat dissipation better than Embodiment 2.

Embodiment 6

Figure 6D:
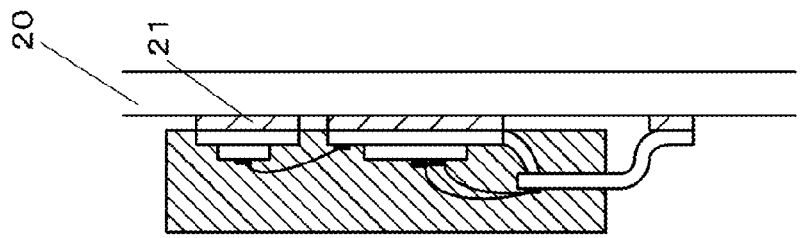
FIGS. 6A-6D are diagrams showing Embodiment 6 of the present invention.
Figure 6C:
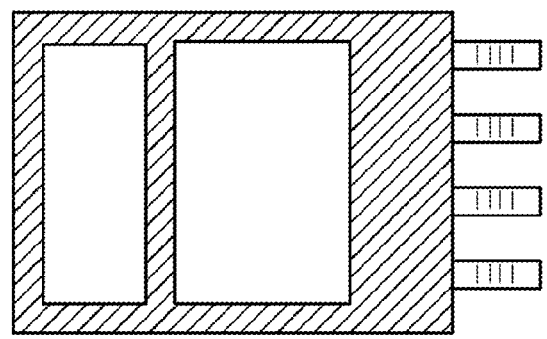
Figure 6B:
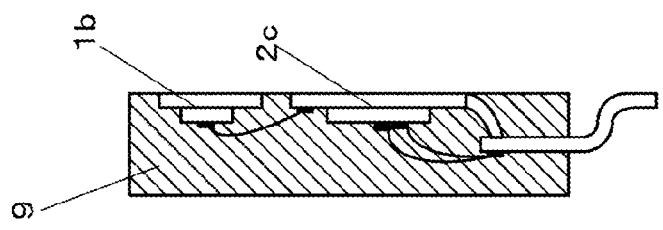
Figure 6A:
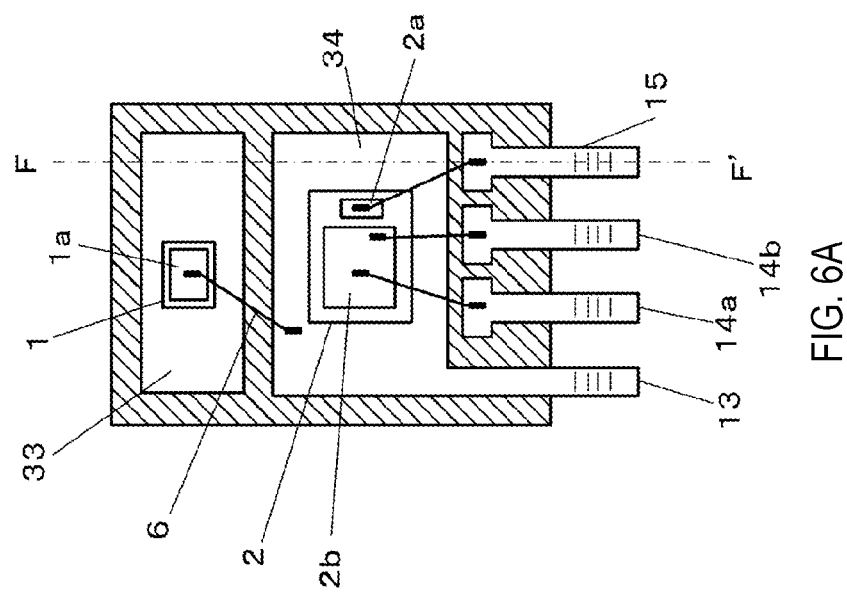

FIGS. 6A-6D show Embodiment 6. FIG. 6A is a plan view (sealing resin on the upper surface is not shown), FIG. 6B a cross-sectional diagram taken along F-F', FIG. 6C a rear view, and FIG. 6D a connection diagram showing how the semiconductor device is connected to a substrate.

The cathode electrode 1b disposed on the rear surface of the diode chip 1 is soldered (not shown) to an upper surface of a first lead frame 33.

The drain electrode 2c disposed on the rear surface of the MOSFET chip 2 is soldered (not shown) to an upper surface of a second lead frame 34.

The drain terminal 13 is disposed in the second lead frame 34.

The anode electrode 1a disposed on the front surface of the diode chip 1 is connected to the second lead frame 34 by a bonding wire 6 and electrically connected to the drain electrode 2c of the MOSFET chip 2.

The gate electrode 2a disposed on the front surface of the MOSFET chip 2 is electrically connected to the gate terminal 15 by a bonding wire 6.

The source electrode 2b disposed on the front surface of the MOSFET chip 2 is electrically connected to the source terminals 14a, 14b by bonding wires 6.

The rear surfaces of the first lead frame 33 and second lead frame 34 on which neither the diode chip 1 nor the MOSFET chip 2 is disposed are disposed so as to be exposed from the sealing resin 9.

The drain terminal 13, source terminal 14a, source terminal 14b, and gate terminal 15 are disposed adjacent to each other in the shape of a surface-mount device (SMD).

Loading the diode chip 1 and the MOSFET chip 2 in a single package can accomplish electrical connection between the anode electrode 1a of the diode chip 1 and the drain electrode 2c of the MOSFET chip 2 in the package. As a result, the occurrence of inductance induced by a wiring pattern (referred to as "wiring inductance," hereinafter) can be curbed, preventing the generation of spike voltage that is caused due to the wiring inductance at the time of a switching operation.

The foregoing package (semiconductor device) is electrically connected to a wiring pattern 21 disposed on a substrate 20 by means of soldering (not shown).

By connecting the rear surface of the first lead frame 33 to the wiring pattern 21, the cathode electrode 1b of the diode chip 1 forms a power circuit such as a PFC circuit.

As a result, the rear surfaces of the first lead frame 33 and second lead frame 34 on which neither the diode chip 1 nor the MOSFET chip 2 is disposed are connected to the substrate, improving the heat dissipation.

Embodiment 6 illustrates an example in which the diode chip 1 and the MOSFET chip 2 are loaded in a single package; however, the MOSFET chip 2 may be replaced with the IGBT chip 7.

Embodiment 7

Figure 7D:
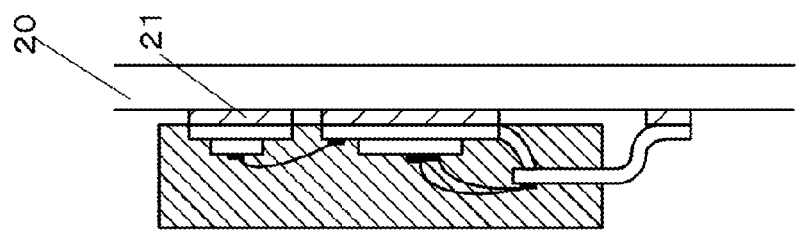
FIGS. 7A-7D are diagrams showing Embodiment 7 of the present invention.
Figure 7C:
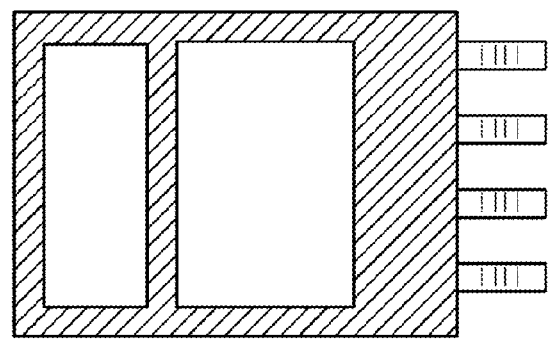
Figure 7B:
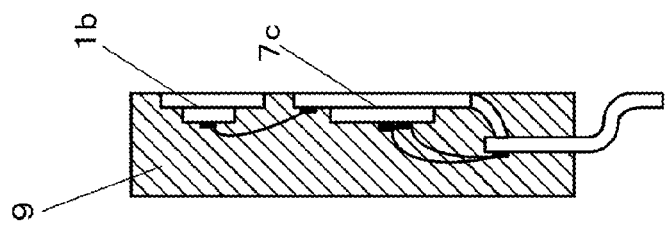
Figure 7A:
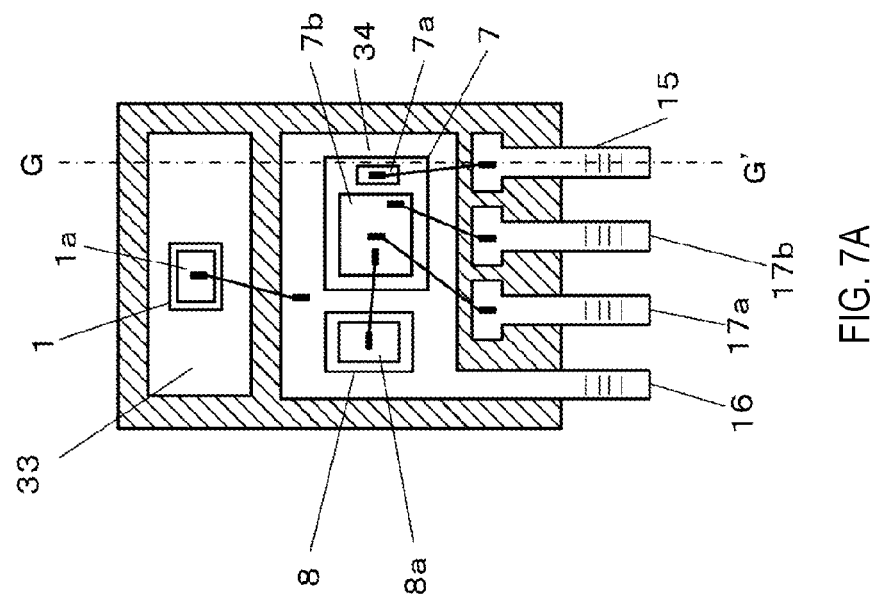

FIGS. 7A-7D show Embodiment 7. FIG. 7A is a plan view (sealing resin on the upper surface is not shown), FIG. 7B a cross-sectional diagram taken along G-G', FIG. 7C a rear view, and FIG. 7D a connection diagram showing how the semiconductor device is connected to the substrate.

The cathode electrode 1b disposed on the rear surface of the diode chip 1 is soldered (not shown) to the upper surface of the first lead frame 33.

The collector electrode 7c disposed on the rear surface of the IGBT chip 7 and the cathode electrode 8b disposed on the rear surface of the free wheeling diode (FWD) chip 8 are soldered (not shown) to the upper surface of the second lead frame 34, wherein the collector electrode 7c and the cathode electrode 8b are electrically connected to each other.

The collector terminal 16 is disposed in the second lead frame 34.

The anode electrode 1a disposed on the front surface of the diode chip 1 is connected to the second lead frame 34 by a bonding wire 6 and electrically connected to the collector electrode 7c of the IGBT chip 7.

The anode electrode 8a disposed on the front surface of the FWD chip 8 is electrically connected to the emitter electrode 7b on the front surface of the IGBT chip 7 by a bonding wire 6.

The gate electrode 7a disposed on the front surface of the IGBT chip 7 is electrically connected to the gate terminal 15 by a bonding wire 6.

The emitter electrode 7b disposed on the front surface of the IGBT chip 7 is electrically connected to the emitter terminals 17a, 17b by bonding wires 6.

The rear surfaces of the first lead frame 33 and second lead frame 34 on which neither the diode chip 1 nor the IGBT chip 7 is disposed are disposed so as to be exposed from the sealing resin 9.

The collector terminal 16, emitter terminal 17a emitter terminal 17b, and gate terminal 15 are disposed adjacent to each other and in the shape of a surface-mount device (SMD).

Loading the diode chip 1, IGBT chip 7, and FWD chip 8 in a single package can accomplish electrical connection between the anode electrode 1a of the diode chip 1 and the collector electrode 7c of the IGBT chip 7 in the package. As a result, the occurrence of inductance induced by a wiring pattern (referred to as "wiring inductance," hereinafter) can be curbed, preventing the generation of spike voltage that is caused due to the wiring inductance at the time of a switching operation.

Loading the FWD chip 8 in the same package can eliminate the wiring pattern of the substrate, accomplishing space conservation.

The foregoing package (semiconductor device) is electrically connected to the wiring pattern 21 disposed on the substrate 20 by means of soldering (not shown).

By connecting the rear surface of the first lead frame 33 to the wiring pattern 21, the cathode electrode 1b of the diode chip 1 forms a power circuit such as a PFC circuit.

As a result, the rear surfaces of the first lead frame 33 and second lead frame 34 on which neither the diode chip 1 nor the MOSFET chip 2 is disposed are connected to the substrate 20, improving the heat dissipation.

Embodiment 8

Figure 8D:
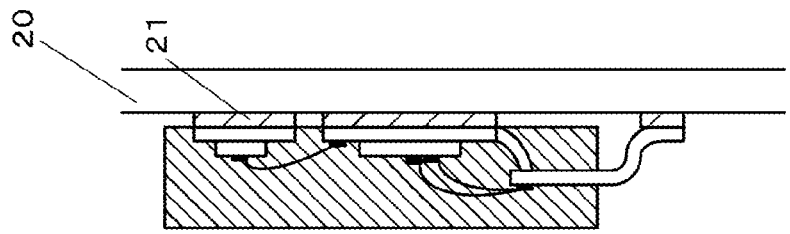
FIGS. 8A-8D are diagrams showing Embodiment 8 of the present invention.
Figure 8C:
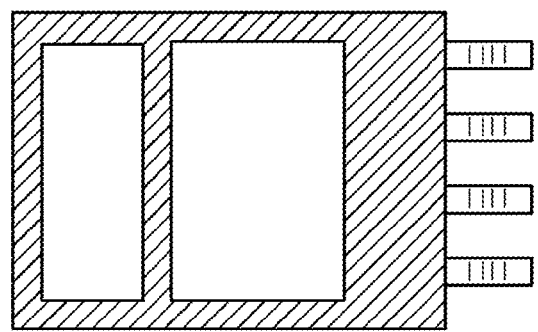
Figure 8B:
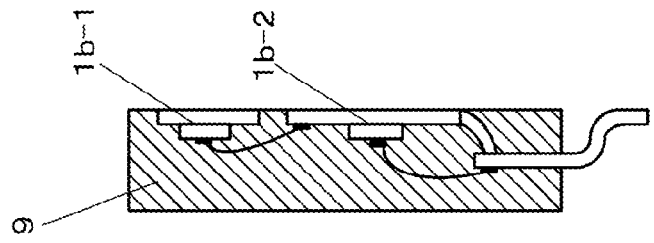
Figure 8A:
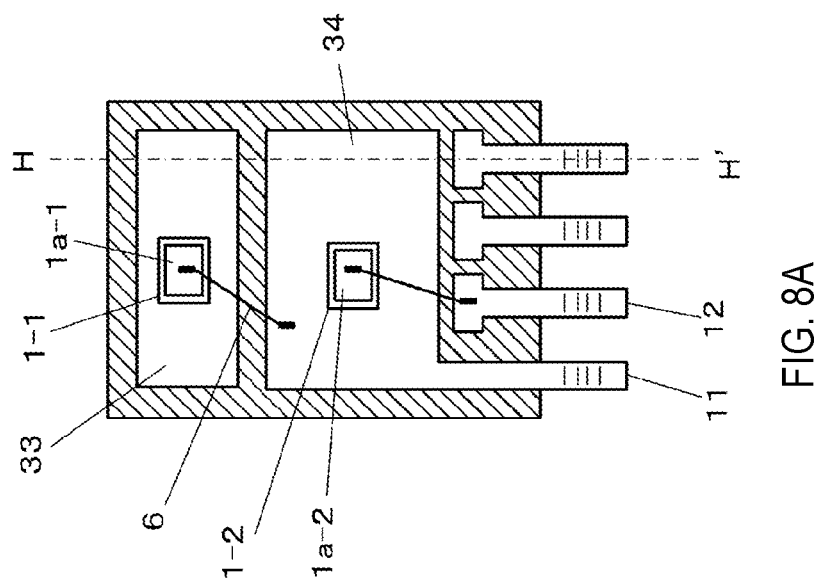

FIGS. 8A-8D show Embodiment 8. FIG. 8A is a plan view (sealing resin on the upper surface is not shown), FIG. 8B a cross-sectional diagram taken along H-H', FIG. 8C a rear view, and FIG. 8D a connection diagram showing how the semiconductor device is connected to the substrate.

A cathode electrode 1b-1 disposed on the rear surface of a diode chip 1-1 is soldered (not shown) to the upper surface of the first lead frame 33.

A cathode electrode 1b-2 disposed on the rear surface of a diode chip 1-2 is soldered (not shown) to the upper surface of the second lead frame 34.

The cathode terminal 11 is disposed in the second lead frame 34.

An anode electrode 1a-1 disposed on the front surface of the diode chip 1-1 is connected to the second lead frame 34 by a bonding wire 6 and electrically connected to the cathode electrode 1b-2 of the diode chip 1-2.

An anode electrode 1a-2 disposed on the front surface of the diode chip 1-2 is electrically connected to an anode terminal 12 by a bonding wire 6.

The rear surfaces of the first lead frame 33 and second lead frame 34 on which the diode chips 1-1, 1-2 are not disposed are disposed so as to be exposed from the sealing resin 9.

The cathode terminal 11 and the anode terminal 12 are disposed adjacent to each other in the shape of a surface-mount device (SMD).

Loading the diode chips 1-1 and 1-2 in a single package can accomplish electrical connection between the anode electrode 1a-1 of the diode chip 1-1 and the cathode electrode 1b-2 of the diode chip 1-2 in the package.

The foregoing package (semiconductor device) is electrically connected to the wiring pattern 21 disposed on the substrate 20 by means of soldering (not shown). This configuration can eliminate the wiring pattern of the substrate, accomplishing space conservation.

By connecting the rear surface of the first lead frame 33 to the wiring pattern 21, the cathode electrode 1b of the diode chip 1 forms a power circuit such as a PFC circuit.

The rear surfaces of the first lead frame 33 and second lead frame 34 on which the diode chips 1-1, 1-2 are not disposed are connected to the substrate, improving the heat dissipation.

Embodiment 9

Figure 9D:
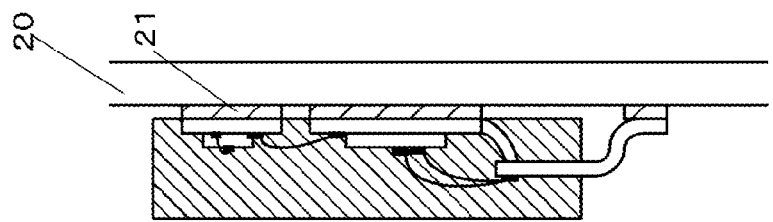
FIGS. 9A-9D are diagrams showing Embodiment 9 of the present invention.
Figure 9C:
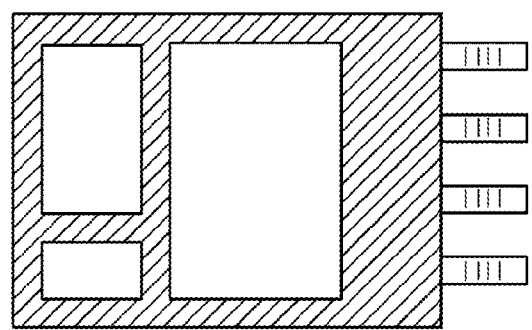
Figure 9B:
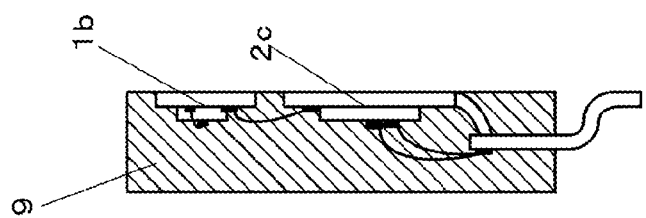
Figure 9A:
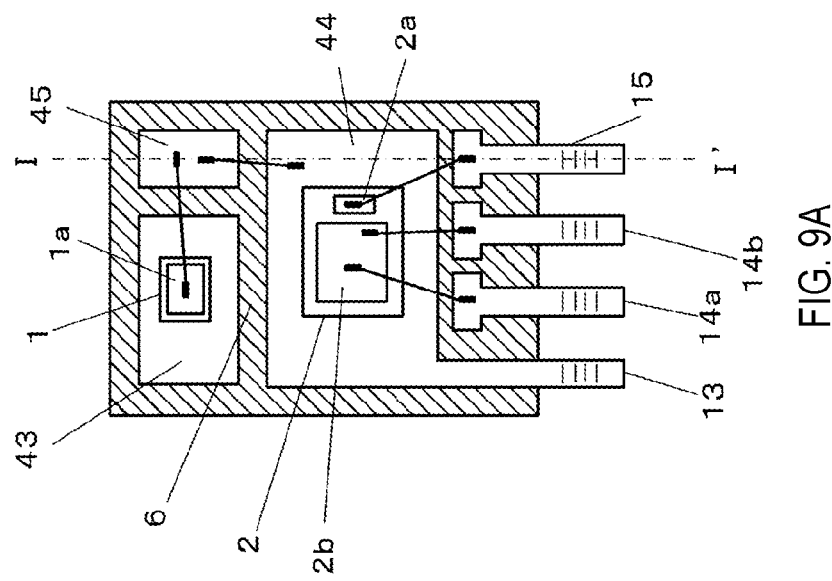

FIGS. 9A-9D show Embodiment 9. FIG. 9A is a plan view (sealing resin on the upper surface is not shown), FIG. 9B a cross-sectional diagram taken along I-I', FIG. 9C a rear view, and FIG. 9D a connection diagram showing how the semiconductor device is connected to the substrate.

The difference with Embodiment 6 is that Embodiment 9 has a third lead frame 45.

The cathode electrode 1b disposed on the rear surface of the diode chip 1 is soldered (not shown) to an upper surface of a first lead frame 43.

The drain electrode 2c disposed on the rear surface of the MOSFET chip 2 is soldered (not shown) to an upper surface of a second lead frame 44.

The drain terminal 13 is disposed in the second lead frame 44.

The anode electrode 1a disposed on the front surface of the diode chip 1 is connected to the third lead frame 45 by a bonding wire 6. In addition, the third lead frame 45 and the second lead frame 44 are connected to each other by a bonding wire 6. Therefore, the anode electrode 1a disposed on the front surface of the diode chip 1 is electrically connected to the drain electrode 2c of the MOSFET chip 2 with the third lead frame 45 therebetween.

The gate electrode 2a disposed on the front surface of the MOSFET chip 2 is electrically connected to the gate terminal 15 by a bonding wire 6.

The source electrode 2b disposed on the front surface of the MOSFET chip 2 is electrically connected to the source terminals 14a, 14b by bonding wires 6.

The rear surfaces of the first lead frame 43 and second lead frame 44 on which neither the diode chip 1 nor the MOSFET chip 2 is disposed and the rear surface of the third lead frame 45, are disposed so as to be exposed from the sealing resin 9.

The drain terminal 13, source terminal 14a, source terminal 14b, and gate terminal 15 are disposed adjacent to each other in the shape of a surface-mount device (SMD).

Exposing the rear surface of the third lead frame 45 can improve the heat dissipation better than Embodiment 6.

Embodiment 9 illustrates an example in which the diode chip 1 and the MOSFET chip 2 are loaded in a single package; however, the MOSFET chip 2 may be replaced with the IGBT chip 7.

Embodiment 10

FIGS. 10A-10D show Embodiment 10. FIG. 10A is a plan view (sealing resin on the upper surface is not shown), FIG. 10B a cross-sectional diagram taken along J-J', FIG. 10C a rear view, and FIG. 10D a connection diagram showing how the semiconductor device is connected to the substrate.

The different with Embodiment 7 is that Embodiment 10 has the third lead frame 45.

The cathode electrode 1b disposed on the rear surface of the diode chip 1 is soldered (not shown) to the upper surface of the first lead frame 43.

The collector electrode 7c disposed on the rear surface of the IGBT chip 7 and the cathode electrode 8b disposed on the rear surface of the free wheeling diode (FWD) chip 8 are soldered (not shown) to the upper surface of the second lead frame 44, wherein the collector electrode 7c and the cathode electrode 8b are electrically connected to each other.

The collector terminal 16 is disposed in the second lead frame 44.

The anode electrode 1a disposed on the front surface of the diode chip 1 is connected to the third lead frame 45 by a bonding wire 6. In addition, the third lead frame 45 and the second lead frame 44 are connected to each other by a bonding wire 6. Therefore, the anode electrode 1a disposed on the front surface of the diode chip 1 is electrically connected to the collector electrode 7c of the IGBT chip 7 with the third lead frame 45 therebetween.

The anode electrode 8a disposed on the front surface of the FWD chip 8 is electrically connected to the emitter electrode 7b on the front surface of the IGBT chip 7 by a bonding wire 6.

The gate electrode 7a disposed on the front surface of the IGBT chip 7 is electrically connected to the gate terminal 15 by a bonding wire 6.

The emitter electrode 7b disposed on the front surface of the IGBT chip 7 is electrically connected to the emitter terminals 17a, 17b by bonding wires 6.

The rear surfaces of the first lead frame 43 and second lead frame 44 on which neither the diode chip 1 nor the IGBT chip 7 is disposed and the rear surface of the third lead frame 45, are disposed so as to be exposed from the sealing resin 9.

The collector terminal 16, emitter terminal 17a, emitter terminal 17b, and gate terminal 15 are disposed adjacent to each other in the shape of a surface-mount device (SMD).

Exposing the rear surface of the third lead frame 45 can improve the heat dissipation better than Embodiment 6.

Embodiment 11

Figure 11A:
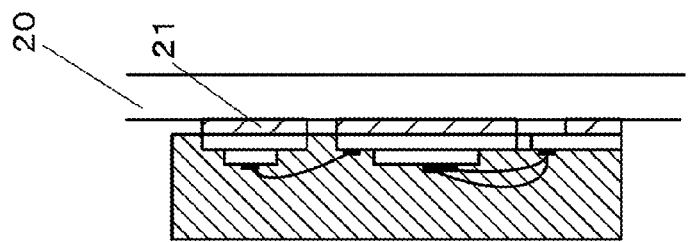
FIGS. 11A-11D are diagrams showing Embodiment 11 of the present invention.
Figure 11B:
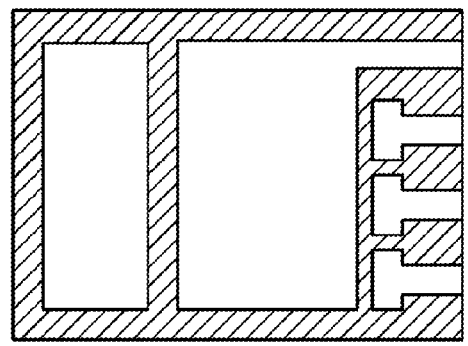
Figure 11C:
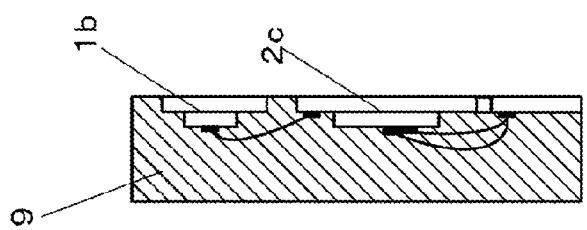
Figure 11D:
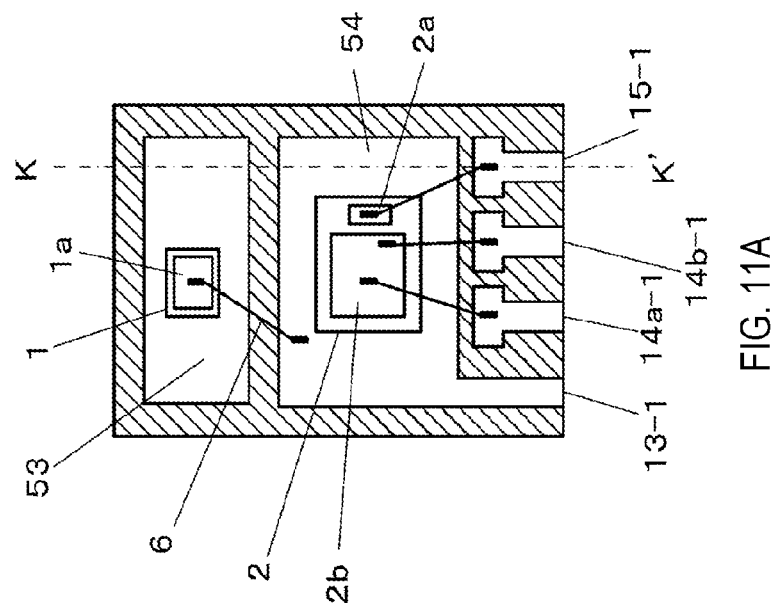

FIGS. 11A-11D show Embodiment 11. FIG. 11A is a plan view (sealing resin on the upper surface is not shown), FIG. 11B a cross-sectional diagram taken along K-K', FIG. 11C a rear view, and FIG. 11D a connection diagram showing how the semiconductor device is connected to the substrate.

The difference with Embodiment 6 is that in Embodiment 11 a drain terminal 13-1, a source terminal 14a-1, a source terminal 14b-1, and a gate terminal 15-1 are exposed from the sealing resin 9 so as to be flush with the rear surfaces of a first lead frame 53 and a second lead frame 54.

Embodiment 11 can achieve the same effects as Embodiment 6.

Similarly, the collector terminal 16, emitter terminal 17a, emitter terminal 17b, and gate terminal 15 of Embodiment 7 may be exposed from the sealing resin 9 so as to be flush with the rear surfaces of the first lead frame 33 and second lead frame 34.

Embodiment 12

Figure 12D:
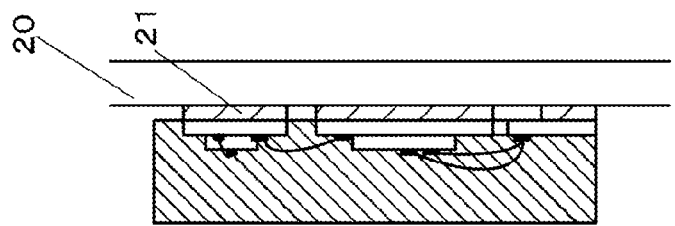
FIGS. 12A-12D are diagrams showing Embodiment 12 of the present invention.
Figure 12C:
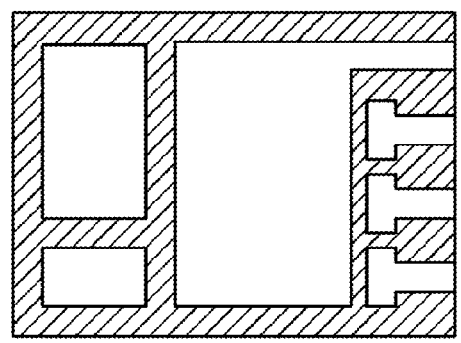
Figure 12B:
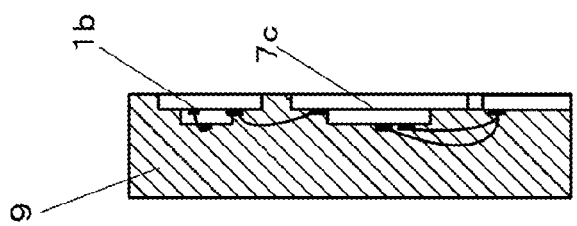
Figure 12A:
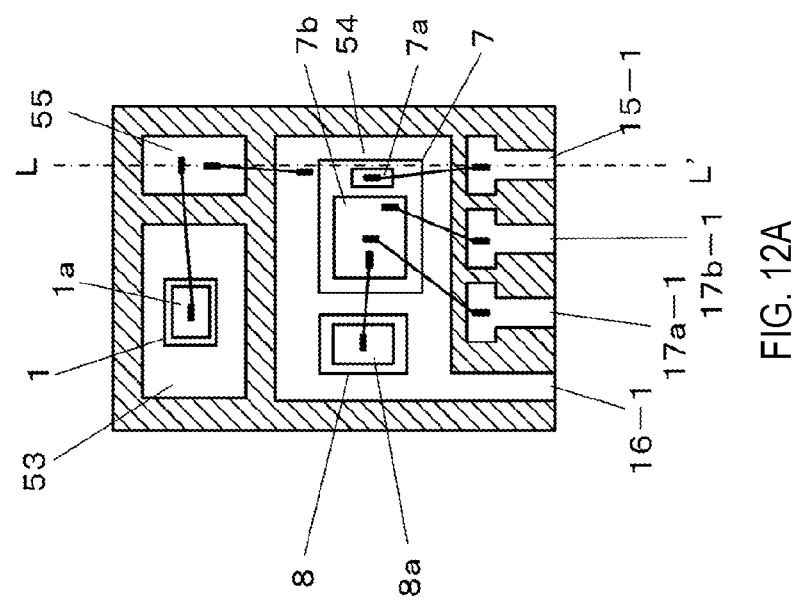

FIGS. 12A-12D show Embodiment 12. FIG. 12A is a plan view (sealing resin on the upper surface is not shown), FIG. 12B a cross-sectional diagram taken along L-L', FIG. 12C a rear view, and FIG. 12D a connection diagram showing how the semiconductor device is connected to the substrate.

The difference with Embodiment 10 is that in Embodiment 12 a collector terminal 16-1, an emitter terminal 17a-1, an emitter terminal 17b-1, and the gate terminal 15-1 are exposed from the sealing resin 9 so as to be flush with the rear surfaces of the first lead frame 53 and second lead frame 54.

Embodiment 12 can achieve the same effects as Embodiment 10.

Similarly, the drain terminal 13, source terminal 14a, source terminal 14b, and gate terminal 15 of Embodiment 9 may be exposed from the sealing resin 9 so as to be flush with the rear surfaces of the first lead frame 43 and second lead frame 44.

Embodiment 13

Figure 13D:
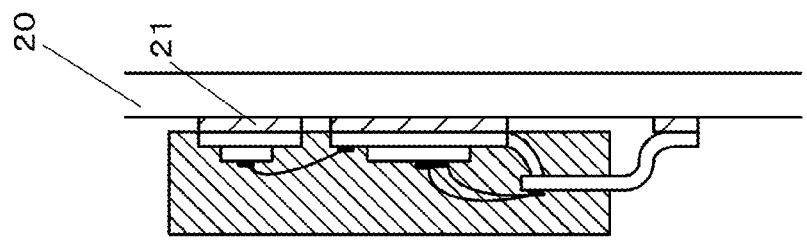
FIGS. 13A-13D are diagrams showing Embodiment 13 of the present invention.
Figure 13C:
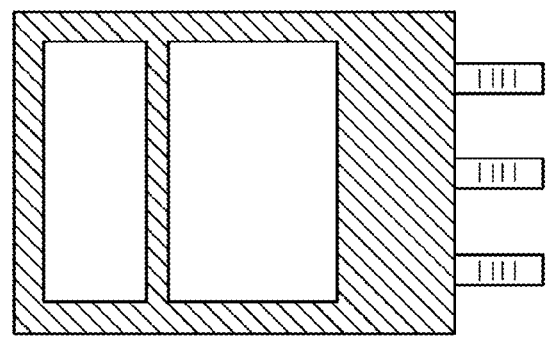
Figure 13B:
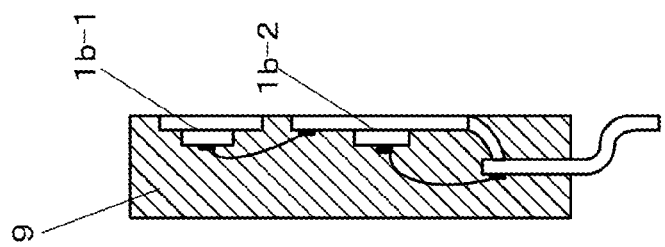
Figure 13A:
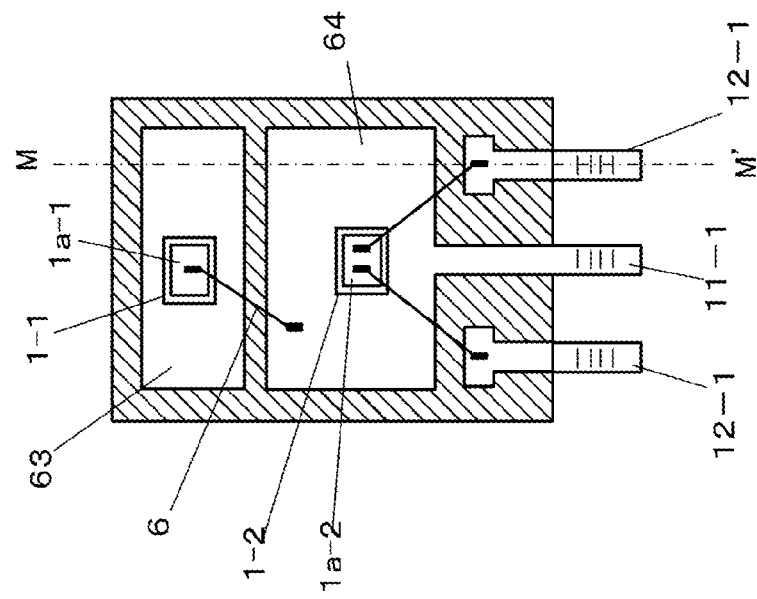

FIGS. 13A-13D show Embodiment 13. FIG. 13A is a plan view (sealing resin on the upper surface is not shown), FIG. 13B a cross-sectional diagram taken along M-M', FIG. 13C a rear view, and FIG. 13D a connection diagram showing how the semiconductor device is connected to the substrate.

The cathode electrode 1b-1 disposed on the rear surface of the diode chip 1-1 is soldered (not shown) to an upper surface of a first lead frame 63.

The cathode electrode 1b-2 disposed on the rear surface of the diode chip 1-2 is soldered (not shown) to an upper surface of a second lead frame 64.

A cathode terminal 11-1 is disposed in the second lead frame 64.

The anode electrode 1a-1 disposed on the front surface of the diode chip 1-1 is connected to the first lead frame 63 by a bonding wire 6 and electrically connected to the cathode electrode 1b-2 of the diode chip 1-2.

The anode 1a-2 disposed on the front surface of the diode chip 1-2 is electrically connected to two anode terminals 12-1, which are disposed to sandwich the cathode terminal 11-1, by bonding wires 6.

The rear surfaces of the first lead frame 63 and second lead frame 64 on which the diode chips 1-1, 1-2 are not disposed are disposed so as to be exposed from the sealing resin 9.

The cathode terminal 11-1 and the anode terminals 12-1 are disposed adjacent to each other.

Loading the diode chips 1-1 and 1-2 in a single package can accomplish electrical connection between the anode electrode 1a of the diode chip 1-1 and the cathode electrode 1b-2 of the diode chip 1-2 in the package.

The foregoing package (semiconductor device) is electrically connected to the wiring pattern 21 disposed on the substrate 20 by means of soldering (not shown). This configuration can eliminate the wiring pattern of the substrate, accomplishing space conservation.

By connecting the rear surface of the first lead frame 63 to the wiring pattern 21, the cathode electrode 1b of the diode chip 1 forms a power circuit such as a PFC circuit.

The rear surfaces of the first lead frame 63 and second lead frame 64 on which the diode chips 1-1, 1-2 are not disposed are connected to the substrate, improving the heat dissipation.

Embodiment 14

Figure 14A:
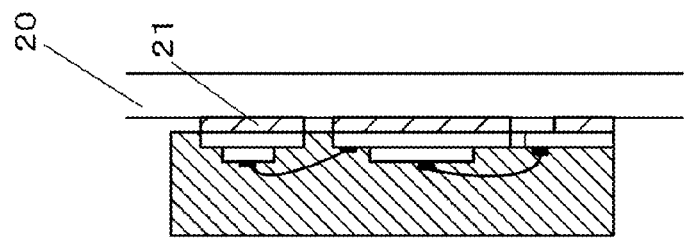
FIGS. 14A-14D are diagrams showing Embodiment 14 of the present invention.
Figure 14B:
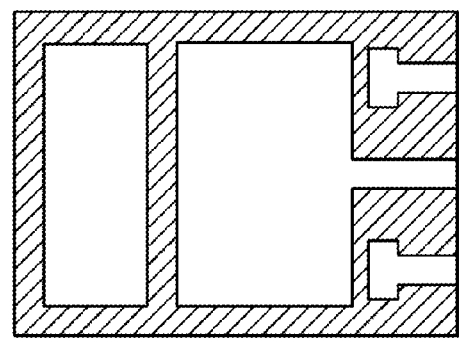
Figure 14C:
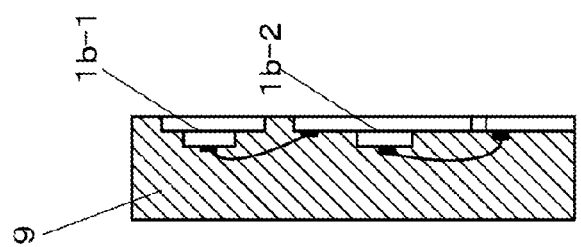
Figure 14D:
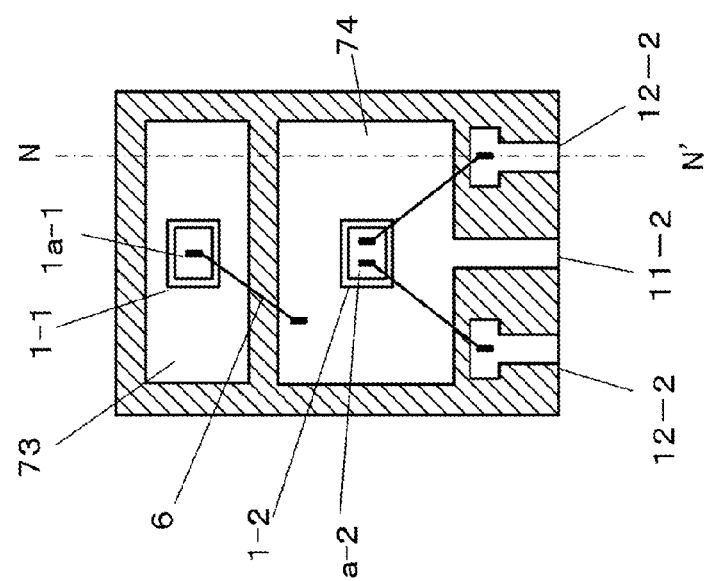
Figure 16:
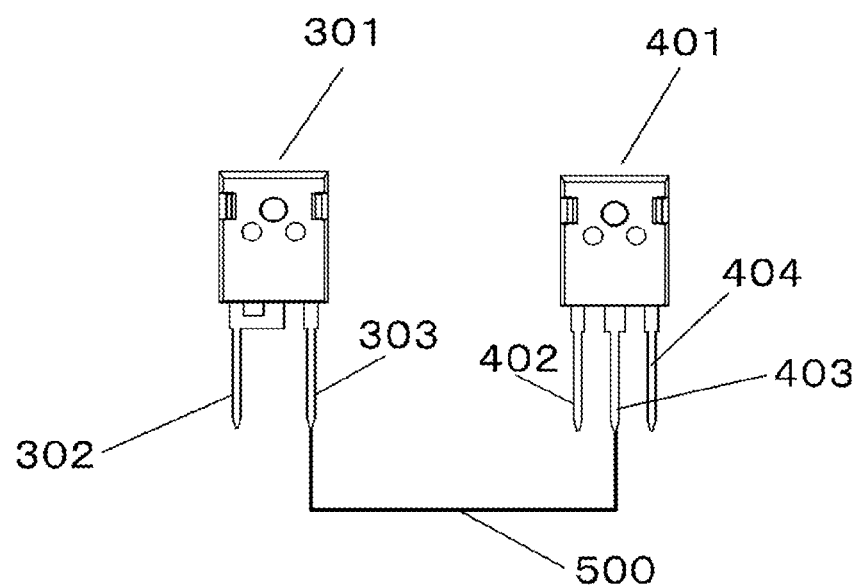
FIG. 16 is a diagram showing a conventional technology.

FIGS. 14A-14D show Embodiment 14. FIG. 14A is a plan view (sealing resin on the upper surface is not shown), FIG. 14B a cross-sectional diagram taken along N-N', FIG. 14C a rear view, and FIG. 14D a connection diagram showing how the semiconductor device is connected to the substrate.

The difference with Embodiment 13 is that in Embodiment 14 a cathode terminal 11-2 and an anode terminal 12-2 are exposed from the sealing resin 9 so as to be flush with the rear surfaces of a first lead frame 73 and a second lead frame 74.

Embodiment 14 can achieve the same effects as Embodiment 13.

The above has described the embodiments of the present invention. However, the technical scope of the present invention is not limited to the scope of the foregoing embodiments. It is obvious to a person skilled in the art that various modifications and improvements can be made to these embodiments. It is apparent from the description of the claims that embodiments with such modifications and improvements also belong to the technical scope of the present invention.

EXPLANATION OF REFERENCE NUMERALS 1, 1-1, 1-2 Diode chip
1a, 1a-1, 1a-2 Anode electrode
1b, 1b-1, 1b-2 Cathode electrode
2 MOSFET chip
2a Gate electrode
2b Source electrode
2c Drain electrode
3, 23, 25, 33, 43, 53, 63, 73 First lead frame
4, 24, 26, 34, 44, 54, 64, 74 Second lead frame
5, 45, 55 Third lead frame
6 Bonding wire
7 IGBT chip
7a Gate electrode
7b Emitter electrode
7c Collector electrode
8 FWD chip
8a Anode electrode
8b Cathode electrode
9 Sealing resin
11, 11-1, 11-2 Cathode terminal
12, 12-2, 12-2 Anode terminal
13, 13-1 Drain terminal
14, 14a, 14b, 14a-1, 14b-1 Source terminal
15, 15-1 Gate terminal
16, 16-1 Collector terminal
17, 17a, 17b, 17a-1, 17b-1 Emitter terminal
18 Through-hole
20 Substrate
21 Wiring pattern
201 Diode
202 MOSFET
301 Diode element
302 Cathode terminal
303 Anode terminal
401 MOSFET element
402 Gate terminal
403 Drain terminal
404 Source terminal
500 Wiring pattern

What is claimed is:

1. A semiconductor device, comprising:
a first lead frame; and
a second lead frame,
wherein the first lead frame has a first terminal,
a second lead frame has a second terminal,
one of principal surfaces of the first lead frame has a first semiconductor chip,
one of principal surfaces of the second lead frame has a second semiconductor chip,
a first electrode disposed on a front surface of the first semiconductor chip is electrically connected to the principal surface of the second lead frame by a bonding wire,
a front surface of the second semiconductor chip has a second electrode and a third electrode,
the second electrode is electrically connected to a third terminal and a fourth terminal by bonding wires,
the third electrode is electrically connected to a fifth terminal by a bonding wire, and
another of the principal surfaces of the first lead frame and another of the principal surfaces of the second lead frame are disposed so as to be exposed from a sealing resin.
2. The semiconductor device according to claim 1, wherein
the first electrode is connected to one of principal surfaces of a third lead frame by a bonding wire, the principal surface of the third lead frame is connected to the principal surface of the second lead frame by a bonding wire, and another of the principal surfaces of the third lead frame is exposed from the sealing resin.

3. The semiconductor device according to claim 1, wherein the first terminal, the second terminal, the third terminal, the fourth terminal, and the fifth terminal are disposed so as to be exposed from the sealing resin.

4. The semiconductor device according to claim 1, wherein a through-hole is provided between the first lead frame and the second lead frame.

5. A semiconductor device, comprising:
a first lead frame; and
a second lead frame,
wherein the first lead frame has a first terminal,
a second lead frame has a second terminal,
one of principal surfaces of the fourth lead frame has a first semiconductor chip,
one of principal surfaces of the second lead frame has a second semiconductor chip and a third semiconductor chip,
a first electrode disposed on a front surface of the first semiconductor chip is electrically connected to the principal surface of the second lead frame by a bonding wire,
a front surface of the first semiconductor chip has a second electrode and a third electrode,
a front surface of the second semiconductor chip has a fourth electrode,
the second electrode is electrically connected a third terminal and a fourth terminal by bonding wires,
the second electrode is electrically connected to a fifth terminal by a bonding wire,
the fourth electrode is electrically connected to the second electrode by a bonding wire, and
another of the principal surfaces of the second lead frame and another of the principal surfaces of the second lead frame are disposed so as to be exposed from a sealing resin.

6. The semiconductor device according to claim 5, wherein
the first electrode is connected to one of principal surfaces of a third lead frame by a bonding wire,
the principal surface of the third lead frame is connected to the principal surface of the second lead frame by a bonding wire, and
another of the principal surfaces of the third lead frame is exposed from the sealing resin.

7. The semiconductor device according to claim 5, wherein the first terminal, the second terminal, the third terminal, the fourth terminal, and the fifth terminal are disposed so as to be exposed from the sealing resin.

8. A semiconductor device, comprising:
a first lead frame; and
a second lead frame,
wherein the second lead frame has a first terminal,
one of principal surfaces of the first lead frame has a first semiconductor chip,
one of principal surfaces of the second lead frame has a second semiconductor chip,
a first electrode disposed on a front surface of the first semiconductor chip is electrically connected to the principal surface of the second lead frame by a bonding wire,
a front surface of the second semiconductor chip has a second electrode and a third electrode, the second electrode is electrically connected to a second terminal and a third terminal by bonding wires,
the third electrode is electrically connected to a fourth terminal by a bonding wire, and
another of the principal surfaces of the first lead frame and another of the principal surfaces of the second lead frame are disposed so as to be exposed from a sealing resin.

9. The semiconductor device according to claim 8, wherein
the first electrode is connected to one of principal surfaces of a third lead frame by a bonding wire,
the principal surface of the third lead frame is connected to the principal surface of the second lead frame by a bonding wire, and
another of the principal surfaces of the third lead frame is exposed from the sealing resin.

10. The semiconductor device according to claim 8, wherein the first terminal, the second terminal, the third terminal, and the fourth terminal are disposed so as to be exposed from the sealing resin.

11. The semiconductor device according to claim 8, wherein another of the principal surfaces of the first lead frame is electrically connected to a wiring pattern disposed on a substrate.

12. A semiconductor device, comprising:
a first lead frame; and
a second lead frame,
wherein the second lead frame has a first terminal,
one of principal surfaces of the first lead frame has a first semiconductor chip,
one of principal surfaces of the second lead frame has a second semiconductor chip and a third semiconductor chip,
a first electrode disposed on a front surface of the first semiconductor chip is electrically connected to the principal surface of the second lead frame by a bonding wire,
a front surface of the second semiconductor chip has a second electrode and a third electrode,
a front surface of the third semiconductor chip has a fourth electrode,
the second electrode is electrically connected to a second terminal and a third terminal by bonding wires,
the third electrode is electrically connected to a fourth terminal by a bonding wire,
the fourth electrode is electrically connected to the second electrode by a bonding wire, and
another of the principal surfaces of the second lead frame and another of the principal surfaces of the first lead frame are disposed so as to be exposed from a sealing resin.

13. The semiconductor device according to claim 12, wherein
the first electrode is connected to one of principal surfaces of a third lead frame by a bonding wire,
the principal surface of the third lead frame is connected to the principal surface of the second lead frame by a bonding wire, and
another of the principal surfaces of the third lead frame is exposed from the sealing resin.

14. The semiconductor device according to claim 12, wherein
the first terminal, the second terminal, the third terminal, and the fourth terminal are disposed so as to be exposed from the sealing resin.

15. The semiconductor device according to claim 12, wherein another of the principal surfaces of the first lead frame is electrically connected to a wiring pattern disposed on a substrate.

16. A semiconductor device, comprising:
a first lead frame; and
a second lead frame,
wherein the second lead frame has a first terminal,
one of principal surfaces of the first lead frame has a first semiconductor chip,
one of principal surfaces of the second lead frame has a second semiconductor chip,
a first electrode disposed on a front surface of the second semiconductor chip is electrically connected to the principal surface of the second lead frame a by a bonding wire,
a front surface of the second semiconductor chip has a second electrode,
the second electrode is electrically connected to a second terminal by a bonding wire, and
another of the principal surfaces of the first lead frame and another of the principal surfaces of the second lead frame are disposed so as to be exposed from a sealing resin.

17. The semiconductor device according to claim 16, wherein the second electrode is electrically connected to the second terminal disposed on two sides of the first terminal by means of wire bonding.

18. The semiconductor device according to claim 16, wherein the first terminal and the second terminal are disposed so as to be exposed from the sealing resin.

19. The semiconductor device according to claim 16, wherein another of the principal surfaces of the first lead frame is electrically connected to a wiring pattern disposed on a substrate.

* * * * *